(12) United States Patent
Ye et al.

(10) Patent No.: US 8,065,636 B2
(45) Date of Patent: Nov. 22, 2011

(54) SYSTEM AND METHOD FOR CREATING A FOCUS-EXPOSURE MODEL OF A LITHOGRAPHY PROCESS

(75) Inventors: Jun Ye, Palo Alto, CA (US); Yu Cao, Cupertino, CA (US); Luoqi Chen, San Jose, CA (US); Hua-Yu Liu, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 38 days.

(21) Appl. No.: 12/782,666

(22) Filed: May 18, 2010

(65) Prior Publication Data

US 2010/0229147 A1    Sep. 9, 2010

Related U.S. Application Data

(62) Division of application No. 11/461,994, filed on Aug. 2, 2006, now Pat. No. 7,747,978.

(60) Provisional application No. 60/706,144, filed on Aug. 8, 2005.

(51) Int. Cl.
G06F 17/50 (2006.01)

(52) U.S. Cl. ............................................. 716/50; 430/5

(58) Field of Classification Search .................... 716/50; 430/5

See application file for complete search history.

(56) References Cited

U.S. PATENT DOCUMENTS

| | | | |
|---|---|---|---|
| 5,558,963 A | 9/1996 | Tsudaka et al. | |
| 5,723,235 A | 3/1998 | Tsudaka et al. | |
| 6,749,972 B2 | 6/2004 | Yu | |
| 6,828,542 B2 | 12/2004 | Ye et al. | |
| 6,884,984 B2 | 4/2005 | Ye et al. | |
| 6,913,861 B2 | 7/2005 | Shishido et al. | |
| 6,954,911 B2 | 10/2005 | Pierrat | |
| 7,003,758 B2 | 2/2006 | Ye et al. | |
| 7,049,589 B2 * | 5/2006 | Yamaguchi et al. | 250/310 |
| 7,224,437 B2 * | 5/2007 | Percin et al. | 355/55 |
| 7,336,341 B2 | 2/2008 | Mimotogi et al. | |

(Continued)

FOREIGN PATENT DOCUMENTS

JP          07-175204          7/1995

(Continued)

OTHER PUBLICATIONS

Japanese Office Action mailed Feb. 16, 2011 in corresponding Japanese Patent Application No. 2008-526083.

(Continued)

*Primary Examiner* — Naum Levin
(74) *Attorney, Agent, or Firm* — Pillsbury Winthrop Shaw Pittman LLP

(57) ABSTRACT

A system and a method for creating a focus-exposure model of a lithography process are disclosed. The system and the method utilize calibration data along multiple dimensions of parameter variations, in particular within an exposure-defocus process window space. The system and the method provide a unified set of model parameter values that result in better accuracy and robustness of simulations at nominal process conditions, as well as the ability to predict lithographic performance at any point continuously throughout a complete process window area without a need for recalibration at different settings. With a smaller number of measurements required than the prior-art multiple-model calibration, the focus-exposure model provides more predictive and more robust model parameter values that can be used at any location in the process window.

24 Claims, 9 Drawing Sheets

U.S. PATENT DOCUMENTS

| | | | |
|---|---|---|---|
| 7,352,453 B2 * | 4/2008 | Mieher et al. | 356/125 |
| 7,444,615 B2 | 10/2008 | Percin et al. | |
| 7,470,492 B2 * | 12/2008 | Bigwood et al. | 430/30 |
| 7,473,495 B2 * | 1/2009 | Tanaka et al. | 430/5 |
| 7,488,933 B2 | 2/2009 | Ye et al. | |
| 7,588,868 B2 | 9/2009 | Zach et al. | |
| 7,791,732 B2 * | 9/2010 | Den Boef et al. | 356/456 |
| 2004/0156030 A1 | 8/2004 | Hansen | |
| 2004/0190008 A1 | 9/2004 | Mieher et al. | |
| 2004/0195507 A1 * | 10/2004 | Yamaguchi et al. | 250/310 |
| 2005/0166174 A1 | 7/2005 | Ye et al. | |
| 2006/0206851 A1 | 9/2006 | Van Wingerden et al. | |
| 2006/0273266 A1 | 12/2006 | Preil et al. | |

FOREIGN PATENT DOCUMENTS

| | | |
|---|---|---|
| JP | 2000-232057 | 8/2000 |
| JP | 2003-164797 | 6/2003 |
| JP | 2003-243291 | 8/2003 |
| JP | 2005-217378 | 8/2005 |
| JP | 2006-512758 T | 4/2006 |
| JP | 2009-105430 | 5/2009 |

OTHER PUBLICATIONS

Y Cao et al. "Optimized Hardware and Software for Fast, Full Chip Simulation" Proc. SPIE vol. 5754, pp. 407-414, (2005).

B.J. Lin "The Exposure-Defocus Forest" Jpn. J. Appl. Phys. vol. 33, pp. 6756-6764 (1994).

A. Borjon et al. "High Accuracy 65nm OPC Verification: Full Process Window Model vs. Critical Failure ORC" Proc. SPIE vol. 5754, pp. 1190-1201 (2005).

B. Tollkuhn et al. "Do We Need Complex Resist Models for Predictive Simulation of Lithographic Process Performance?" Proc. SPIE vol. 5376, pp. 983-994 (2004).

* cited by examiner

| Focus<br>Dose | -150 nm | -100 nm | 0 nm | 100 nm | 150 nm |
|---|---|---|---|---|---|
| 4.82% |  | X |  | X |  |
| 2.41% |  |  | X |  |  |
| 0 | X | X | X | X | X |
| -2.41% |  |  | X |  |  |
| -4.82% |  | X |  | X |  |

| Sampling | | # of Cal Points | # of Verify Pts | Total RMS | Max. RMS |
|---|---|---|---|---|---|
| All | | 11 | 0 | 3.68 | 4.95 |
| All– (+/- 150nm) | | 9 | 2 | 3.78 | 5.04 |
| Cross | | 5 | 6 | 3.70 | 5.29 |
| 4 Corners | | 5 | 6 | 4.26 | 5.26 |
| Defocus only | | 5 | 6 | 3.70 | 5.25 |
| Exposure only | | 3 | 8 | 6.98 | 13.3 |
| Simply Defocus | | 3 | 8 | 3.71 | 5.11 |

FIG. 5

| | FEM | Multi-Model |
|---|---|---|
| # of wafer measurements for base model | N | N |
| # of additional PW sampling locations | x | x |
| Required measurements per add'l PW sampling location | 15%*N | N |
| Total wafer measurements for PW models | (1 + 0.15x)N | (1 + x)N |
| # of model calibrations required | 1 | 1 + x |
| Separable common mask, optical (exclude focus & exposure), and resist terms in the PW model set | Yes | No |
| Capability of generating additional models for additional PW conditions | Yes | No |
| # of total PW models within the boundary defined by the sampling locations | Unlimited | 1 + x |
| PW model coverage | 100% | Partial |

FIG. 6

SYSTEM AND METHOD FOR CREATING A FOCUS-EXPOSURE MODEL OF A LITHOGRAPHY PROCESS

CROSS-REFERENCE TO RELATED APPLICATIONS

The present application is a divisional of U.S. patent application Ser. No 11/461,994, filed Aug. 2, 2006, and claims priority to U.S. Prov. Appln. No. 60/706,144, filed Aug. 8, 2005, the contents of such applications being incorporated by reference herein in their entirety.

FIELD OF THE INVENTION

This invention relates generally to optical lithography and more particularly to creating a focus-exposure model of a lithography process.

BACKGROUND OF THE INVENTION

The integrated circuit industry has, since its inception, maintained a remarkable growth rate by driving increased device functionality at lower cost. Leading edge devices today provide the computing power of computers that used to occupy entire rooms at a mere fraction of the cost. Many of today's low cost consumer devices include functionality that only a few years ago was unavailable at any cost, such as video cell phones, ultra-portable media players, and wireless or ultra-wideband Internet devices. One of the primary enabling factors of this growth has been the ability of optical lithography processes to steadily decrease the smallest feature size that can be patterned as part of the integrated circuit pattern. This steady decline in feature size and cost while at the same time printing more features per circuit is commonly referred to as "Moore's Law" or the lithography "roadmap."

The lithography process involves creating a master image on a mask, or reticle, then replicating that pattern faithfully onto the device wafers. The more times a master pattern is successfully replicated within the design specifications, the lower the cost per finished device or "chip." Until recently, the mask pattern has been an exact duplicate of the desired pattern at the wafer level, with the exception that the mask level pattern may be several times larger than the wafer level pattern. This scale factor is then corrected during wafer exposure by the reduction ratio of the exposure tool. The mask pattern is typically formed by depositing and patterning a light absorbing material on a quartz or other transmissive substrate. The mask is then placed in an exposure tool known as a "stepper" or "scanner" where light of a specific exposure wavelength is directed through the mask onto the device wafers. The light is transmitted through the clear areas of the mask and attenuated by a desired amount, typically between 90% and 100%, in the areas that are covered by the absorbing layer. The light that passes through some regions of the mask may also be phase-shifted by a desired phase angle, typically an integer fraction of 180 degrees. After being collected by the exposure tool, the resulting aerial image pattern is then focused onto the device wafers. A light sensitive material deposited on the wafer surface interacts with the light to form the desired pattern on the wafer, and the pattern is then transferred into the underlying layers on the wafer to form functional electrical circuits according to well known processes.

In recent years, the feature sizes being patterned have become significantly smaller than the wavelength of light used to transfer the pattern. This trend towards "sub-wavelength lithography" has resulted in increasing difficulty in maintaining adequate process margins in the lithography process. The aerial images created by the mask and exposure tool lose contrast and sharpness as the ratio of feature size to wavelength decreases. This ratio is quantified by the k1 factor, defined as the numerical aperture of the exposure tool times the minimum feature size divided by the wavelength. The lack of sharpness or image blur can be quantified by the slope of the aerial image at the threshold for image formation in the resist, a metric known as "edge slope," or "normalized image log slope," often abbreviated as "NILS." The smaller the NILS value, the more difficult it becomes to replicate the image faithfully onto a large number of device patterns with sufficient control to yield economically viable numbers of functional devices. The goal of successful "low-k1 lithography" processes is to maintain the highest NILS possible despite the decreasing k1 value, thereby enabling the manufacturability of the resulting process.

New methods to increase the NILS in low-k1 lithography have resulted in master patterns on the mask that are not exact copies of the final wafer level pattern. The mask pattern is often adjusted in terms of the size of the pattern as a function of pattern density or pitch. Other techniques involve the addition or subtraction of extra corners on the mask pattern ("serifs," "hammerheads," and other patterns), and even the addition of geometries that will not be replicated on the wafer. In order to enhance the printability of the intended features, these non-printing "assist features" may include scattering bars, holes, rings, checkerboards, or "zebra stripes" to change the background light intensity ("gray scaling"), and other structures, which are well documented in the literature. All of these methods are often referred to collectively as "Optical Proximity Correction," or "OPC."

The mask may also be altered by the addition of phase-shifting regions that may or may not be replicated on the wafer. A large variety of phase-shifting techniques has been described at length in the literature including alternate aperture shifters, double expose masking processes, multiple phase transitions, and attenuating phase-shifting masks. Masks formed by these methods are known as "Phase Shifting Masks," or "PSMs." All of these techniques to increase NILS at low-k1, including OPC, PSM, and others, are referred to collectively as "Resolution Enhancement Technologies," or "RETs." The result of all of these RETs, which are often applied to the mask in various combinations, is that the final pattern formed at the wafer level is no longer a simple replicate of the mask level pattern. In fact, it is becoming impossible to look at the mask pattern and simply determine what the final wafer pattern is supposed to look like. This greatly increases the difficulty in verifying that the design data is correct before the mask is made and wafers exposed, as well as verifying that the RETs have been applied correctly and that the mask meets its target specifications.

The cost of manufacturing advanced mask sets is steadily increasing. Currently, the cost has already exceeded one million dollars per mask set for an advanced device. In addition, the turn-around time is always a critical concern. As a result, computer simulations of the lithography process, which assist in reducing both the cost and turn-around time, have become an integral part of semiconductor manufacturing. There are a number of computer software techniques that address needs in lithography simulation. For example, there is first-principle-modeling-based simulation software that conducts detailed simulation of the physical and chemical processes. However, such software often runs extremely slow and hence is limited to extremely small areas of a chip design (on the order of a few square microns). Software tools in this category include "SOLID-C" from Sigma-C (Santa Clara, Calif., USA) and "Prolith" from KLA-Tencor (San Jose, Calif., USA). Although there is computer software that executes and provides simulation results faster, such software uses empirical models that are calibrated to the experimental data (for example, "Calibre" from Mentor-Graphics in Wilsonville, Oreg., USA). Even for the "fast" simulation that uses empirical models, a simulation at a full-chip level often requires tens of hours to many days. A new, fast, and accurate approach has been described in U.S. Pat. No. 7,003,758, entitled "System and Method for Lithography Simulation," the subject matter of which is hereby incorporated by reference in its entirety, and is referred to herein as the "lithography simulation system."

As illustrated schematically in FIG. 1A, a lithography simulation typically consists of several functional steps, and the design/simulation process resembles a linear flow 100. In step 110, a design layout that describes the shapes and sizes of patterns that correspond to functional elements of a semiconductor device, such as diffusion layers, metal traces, contacts, and gates of field-effect transistors, is created. These patterns represent the "design intent" of physical shapes and sizes that need be reproduced on a substrate by the lithography process in order to achieve certain electrical functionality and specifications of the final device.

As described above, numerous modifications to this design layout are required to create the patterns on the mask or reticle used to print the desired structures. In step 120, a variety of RET methods are applied to the design layout in order to approximate the design intent in the actually printed patterns. The resulting "post-RET" mask layout differs significantly from the "pre-RET" design layout created in step 110. Both the pre- and post-RET layouts may be provided to the simulation system in a polygon-based hierarchical data file in, e.g., the GDS or the OASIS format.

The actual mask will further differ from the geometrical, idealized, and polygon-based mask layout because of fundamental physical limitations as well as imperfections of the mask manufacturing process. These limitations and imperfections include, e.g., corner rounding due to finite spatial resolution of the mask writing tool, possible line-width biases or offsets, and proximity effects similar to the effects experienced in projection onto the wafer substrate. In step 130, the true physical properties of the mask may be approximated in a mask model to various degrees of complexity. Mask-type specific properties, such as attenuation, phase shifting design, etc., need be captured by the mask model. The lithography simulation system described in U.S. Pat. No. 7,003,758 may, e.g., utilize an image/pixel-based grayscale representation to describe the actual mask properties.

A central part of lithography simulation is the optical model, which simulates the projection and image forming process in the exposure tool. In step 140, an optical model is generated. The optical model needs to incorporate critical parameters of the illumination and projection system: numerical aperture and partial coherence settings, illumination wavelength, illuminator source shape, and possibly imperfections of the system such as optical aberrations or flare. The projection system and various optical effects, e.g., high-NA diffraction, scalar or vector, polarization, and thin-film multiple reflection, may be modeled by transmission cross coefficients (TCCs). The TCCs may be decomposed into convolution kernels, using an eigen-series expansion. For computation speed, the series is usually truncated based on the ranking of eigen-values, resulting in a finite set of kernels. The more kernels are kept, the less error is introduced by the truncation. The lithography simulation system described in U.S. Pat. No. 7,003,758 allows for optical simulations using a very large number of convolution kernels without negative impact on computation time and therefore enables highly accurate optical modeling. See "Optimized Hardware and Software for Fast, Full Chip Simulation," Y. Cao et al., Proc. SPIE Vol. 5754, 407 (2005). While here the mask model generated in step 130 and the optical model generated in step 140 are considered to be separate models, the mask model may conceptually also be considered as part of an integrated optical model.

Further, in order to predict shapes and sizes of structures formed on a substrate, in step 160 a resist model is used to simulate the effect of projection light interacting with the photosensitive resist layer and the subsequent post-exposure bake (PEB) and development process. A distinction can be made between first-principle simulation approaches that attempt to predict three-dimensional resist structures by evaluating the three-dimensional light distribution in resist, as well as microscopic, physical, or chemical effects such as molecular diffusion and reaction within that layer. On the other hand, all "fast" simulation approaches that may allow full-chip simulation currently restrict themselves to more empirical resist models that employ as an input a two-dimensional aerial image provided by the optical model part of the simulator. This separation between the optical model and the resist model being coupled by an aerial image 150 is schematically indicated in FIG. 1A. For simplicity, here the fact that the resist model may be followed by modeling of further processes, e.g., etch, ion implantation, or similar steps, is omitted.

Finally, in step 170, the output of the simulation process will provide information on the predicted shapes and sizes of printed features on the wafer, such as predicted critical dimensions (CDs) and contours. Such predictions allow a quantitative evaluation of the lithographic printing process and on whether the process will produce the intended results.

In order to provide the predictive capabilities just mentioned, a number of fitting parameters that are not known a priori need be found or tuned in a calibration process. Various methods of calibrating lithography models have been described in the literature. Generally, these calibration methods search for the best overall match between simulated test patterns and corresponding test patterns that are printed on actual wafers and measured by a metrology tool, e.g., a CD-SEM or a scatterometry tool.

Accuracy and robustness of the calibration are required to predict CDs of printed patterns, edge placements, and line end placements. The calibrated model is in general expected to predict one-dimensional as well as two-dimensional optical and processing related proximity effects with sufficient accuracy. It is known that the predictability of empirical models is mostly limited to a pattern geometry space that has been covered by the shape and size variations of the test or gauge structures used in the calibration procedure. A current practice and trend is to include more and more test structure variations to cover as wide and dense a geometry space as practically possible. Typically, thousands of measurement points are utilized for model calibrations. However, currently model calibrations are mostly performed at nominal or "best" optical settings, and therefore only cover the two-dimensional geometry space. Extrapolating these models for use when any non-geometry parameters, e.g., optical parameters or lithography process parameters, are changed is difficult.

On the other hand, it is well known that lithographic processes generally need to be evaluated by their process window or, more precisely, by the common process window of all relevant structures. The size of the process window (PW) is commonly measured by an area in exposure-defocus (E-D)

space over which variations in the CD or edge placement fall within an allowable range. See "The Exposure-Defocus Forest," B. J. Lin, Jpn. J. Appl. Phys. 33, 6756 (1994). Process window analysis takes into account that any actual manufacturing process is subject to unavoidable variations of real parameter values, such as exposure dose and focus settings of the lithographic projection system. The common process window of all structures on a device design defines the process margin, i.e., the tolerance against process parameter variations.

Some recent attempts to predict the through-process window behavior of OPC models by calibrating the resist model at "best" settings and extrapolating towards variations in dose and defocus have not been very successful, unless separate, discrete model calibrations were performed at different defocus settings. See "High accuracy 65 nm OPC verification: full process window model vs. critical failure ORC," A. Borjon et al., Proc. SPIE Vol. 5754, 1190 (2005). FIG. 1B illustrates multiple locations covering a process window space, where separate model calibrations were performed at each location. In other work, attempts were made to calibrate models to several focus-exposure-matrix data sets but only for one-dimensional line-width data. See "Do we need complex resist models for predictive simulation of lithographic process performance?," B. Tollkuhn et al., Proc. SPIE Vol. 5376, 983 (2004).

In addition, "lumped" parameter models exist, in which the response of the system with respect to resist development effects are approximated by artificially changing the optical model parameters and such models may still be able to be well-calibrated against a set of test patterns at one single process window condition. As another example for illustration, it is well-known that spherical aberration of a projection system causes a pattern-pitch dependent focus shift. Consequently, if measured at a single focus setting, a through-pitch "OPC" curve (which plots CD versus pitch) will experience a certain modulation due to the optical effect of spherical aberration. A sufficiently complex resist model having a large enough number of adjustable parameters may still be able to reproduce the OPC curve and in fact predict printed CD through pitch at the exact same focus setting that was used for calibration. However, the ability of the model to extrapolate anywhere outside the immediate parameter space covered by the calibration would be severely limited.

There is a constant need for increased accuracy and robustness of lithography modeling. Clearly there is also a need for model calibration methodologies that enable predictive modeling in a multidimensional parameter space, beyond geometry variations but also PW-related process variations, in order to verify manufacturability of advanced semiconductor designs by simulation.

SUMMARY OF THE INVENTION

A system and a method for creating a focus-exposure model are introduced for the calibration of lithography simulation models. The system and the method utilize calibration data along multiple dimensions of parameter variations, in particular within an exposure-defocus process window space. The system and the method provide a unified set of model parameter values that result in better accuracy and robustness of simulations at nominal process condition, as well as the ability to predict lithographic performance at any point throughout a complete process window area without a need for recalibration.

In one embodiment, a method for creating a focus-exposure model of a lithography process comprises selecting a model of a lithography process, the model including an optical model module, the model having a set of model parameters including focus, exposure, and a set of fitting parameters having variable values, defining a process window for the lithography process in a focus-exposure space, selecting a set of initial fitting parameter values for the model, selecting a plurality of sampling locations within the process window, the plurality of sampling locations including nominal condition, generating simulated results of the lithography process at the plurality of sampling locations within the process window using the model with the set of initial fitting parameter values by varying the values of focus and exposure to correspond with the plurality of sampling locations while holding the set of initial fitting parameter values constant, comparing the simulated results with actual results of the lithography process at all of the plurality of sampling locations within the process window to produce a total difference measure between the simulated results and the actual results, modifying the set of fitting parameter values and generating further simulated results at each of the sampling locations within the process window to identify optimum fitting parameter values such that the total difference measure between the actual results and simulated results produced using the optimum fitting parameter values is minimized or is below a predetermined threshold, and defining the focus-exposure model as the model including the optimum fitting parameter values, the focus-exposure model being capable of simulating the lithography process at any location within the entire process window.

In one embodiment, a system for generating a single process window model for predicting the capability of a photolithography process comprises a storage area for storing information, an input device, an output device, physical model information stored in the storage area, and a model calibration module. The storage area is in communication with the model calibration module such that selected physical model information can be accessed by the model calibration module. The input device is in communication with the model calibration module such that process window definition information defining a process window can be made available to the model calibration module and such that discrete measurement information obtained from measurements of a wafer under different test conditions in the defined process window can be accessed by the model calibration module. In addition, the model calibration module is configured to generate a single process window model by using the process window definition information and the discrete measurement information to calibrate the selected physical model information such that the performance of a photolithography system over the defined process window can be described with two continuously adjustable optical parameters. Generating the single process window model includes comparing the discrete measurement information with simulated measurements, the simulated measurements produced by simulating the lithography process using the selected physical model information by varying the two continuously adjustable optical parameters while holding all other parameters in the physical model information constant.

BRIEF DESCRIPTION OF THE DRAWINGS

FIG. 5 is a chart showing results of calibrations of a focus-exposure model using different sampling schemes, according to one embodiment of the invention;

FIG. 6 is a chart summarizing a comparison between one embodiment of a focus-exposure model calibration and a prior-art multiple-model calibration;

DETAILED DESCRIPTION OF THE PREFERRED EMBODIMENTS

Figure 1A:
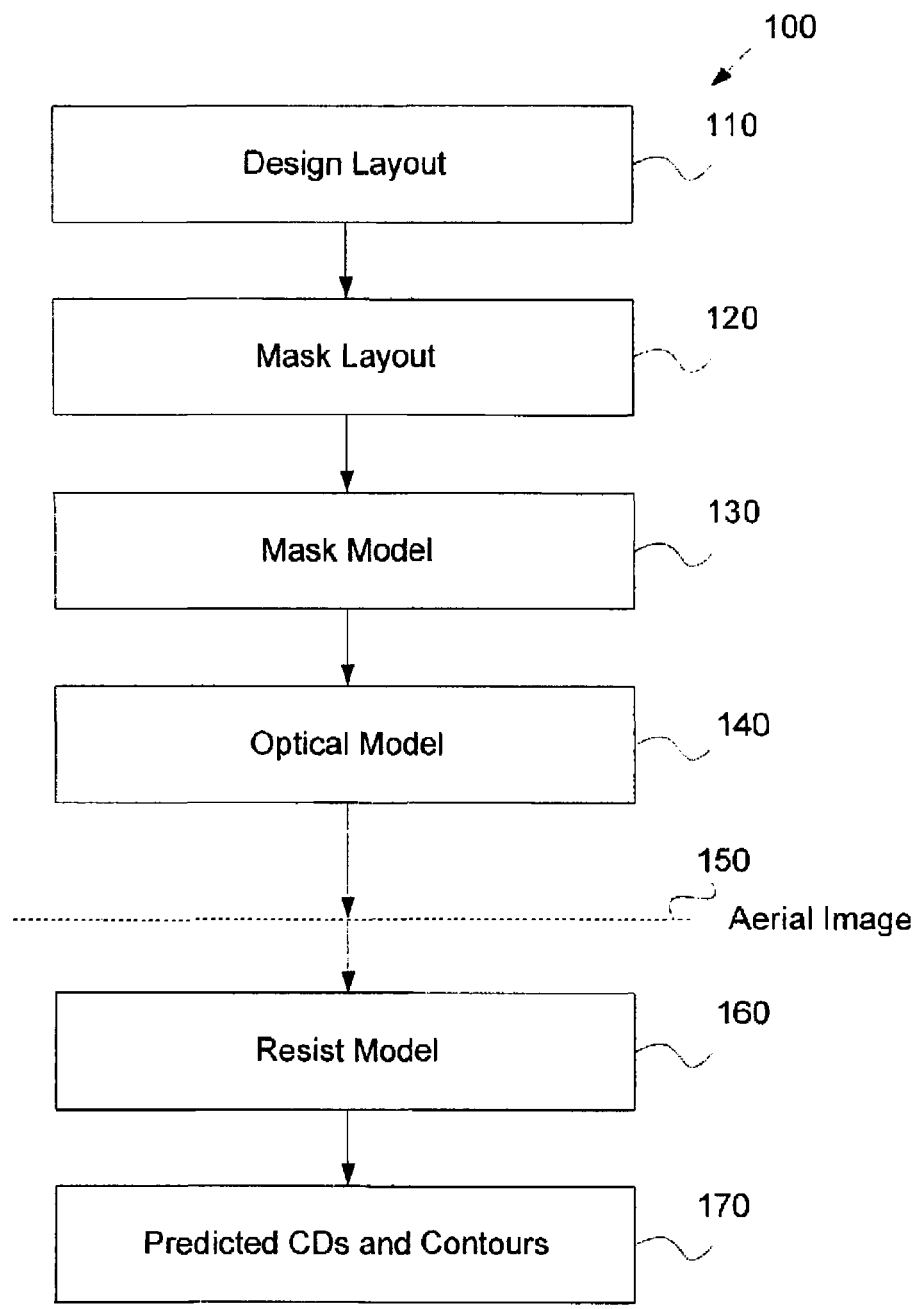
FIG. 1A is a flowchart of method steps for a prior art lithography simulation.
Figure 1B:
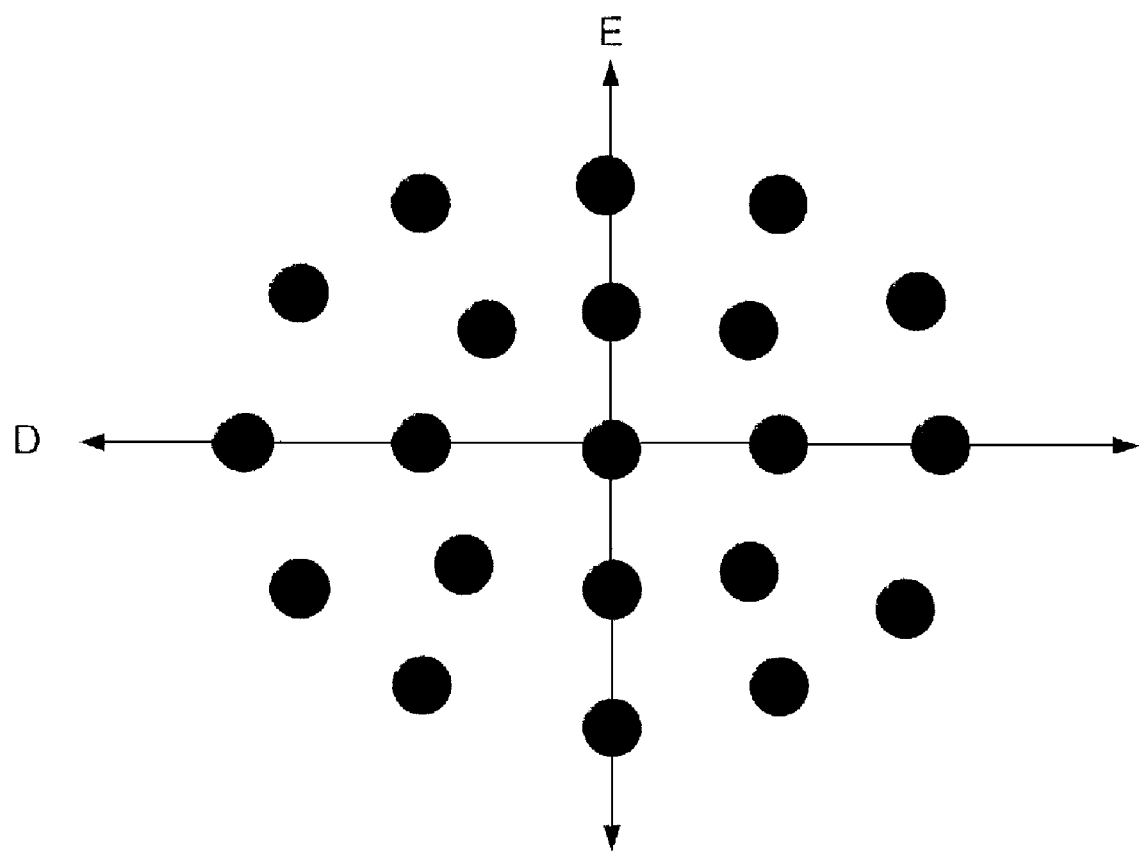
FIG. 1B is a diagram of locations for calibration of multiple lithography simulation models, according to a prior art methodology.

Disclosed are a system and a method based upon model creation and model calibration, which rely upon incorporating data points not only at nominal condition at the center of the process window but also at different locations within the process window at some distance from the center. At minimum, calibration data is collected while varying at least one process parameter (for example, the defocus parameter), and all collected calibration data with the different values of the varied process parameter are utilized for calibration of the model's fitting parameters. The model of the lithography process includes an optical model module, and may optionally include a resist model module, a mask model module, and other appropriate model modules. The model modules of the model of the lithography process will be referred to herein as models, e.g., the optical model and the resist model, for simplicity.

In a preferred implementation, calibration data are collected while varying the parameters of exposure dose and defocus to form a process window space. The method provides joint fitting of test structures at all values of exposure dose and defocus in order to find a single set of calibrated fitting parameters that are predictive of the lithographic printing process at any location in the process window. The calibration method includes simulating the performance of the lithography process at each of a set of sampling locations in the process window using a model of the lithography process including focus and exposure parameters and a set of fitting parameters, where the focus and exposure parameters of the optical model are varied in accordance with first principles while the fitting parameters (i.e., all other model parameters) are unchanged. The model having the set of calibrated fitting parameter values is referred to herein as a focus-exposure model (FEM). Focus is a setting of an optical parameter of the exposure tool, and is sometimes also called defocus. The terms focus and defocus are used interchangeably herein.

A focus-exposure model calibrated at a number of locations throughout a full process window more closely reflects physical reality and is more predictive, accurate, and robust than a model calibrated only at one nominal process condition. Lithography simulation benefits from multidimensional model calibration with 1) better model accuracy, predictability, and robustness at nominal or best settings by relying on interpolation between well-characterized sampling locations in the process window, 2) the ability to predict pattern behavior at any interpolated location within the process window, and 3) focus-exposure model calibration can be achieved with a smaller total number of measurements than calibration of multiple separate models at different discrete locations in the process window.

A key characteristic of the method of calibrating the focus-exposure model is the good separability of optical and resist models, in the sense that the optical model in fact captures accurately the true optical effects, while resist-related parameters do not change with optical settings, e.g., through focus settings. Since the defocus behavior of a printed pattern can be partially compensated by some physical resist effects, e.g., acid diffusion, without joint calibration including defocus data, there will be multiple root mean square (RMS) minimums in the defocus-resist parameter space. Only one of those minimums is physical and correct. Joint calibration throughout the process window automatically constrains the model to the correct minimum points since the trend behavior with defocus is orthogonal to the resist behaviors. Therefore, false "parameter lumping" effects are avoided, and the resulting calibrated model will be more accurate and robust even at nominal exposure conditions. In other words, even at nominal process conditions, the calibrated focus-exposure model will be able to predict the pattern behavior better than a model calibrated only at nominal process conditions.

Although "the process window" is most frequently defined in a two-dimensional exposure-defocus space, the method described herein is not restricted to this definition. This definition inherently reflects that focus and dose variations usually have a dominant impact on lithography process performance. It is possible, however, to generalize the process window concept by using more, or different, parameter dimensions that may be adjusted or varied. Such a generalization will help to capture process margin with respect to these additional parameter variations and may also add further constraints to the model fitting. Additional constraints help make the calibrated model more physical, and hence more accurate and predictive. For example, in a modern exposure tool, many optical settings are adjustable to some extent, including, for example, illumination wavelength or linewidth, lens settings and thereby optical aberrations, and a wide range of illuminator adjustments. Similarly, parameters relating directly to resist layer properties may be varied or adjusted. Any of these or similar parameters may be included in model calibration for the benefit of improved model robustness or accuracy. The calibration process may also utilize test data from a set of nominally identical exposure tools in a production environment.

Figure 2A:
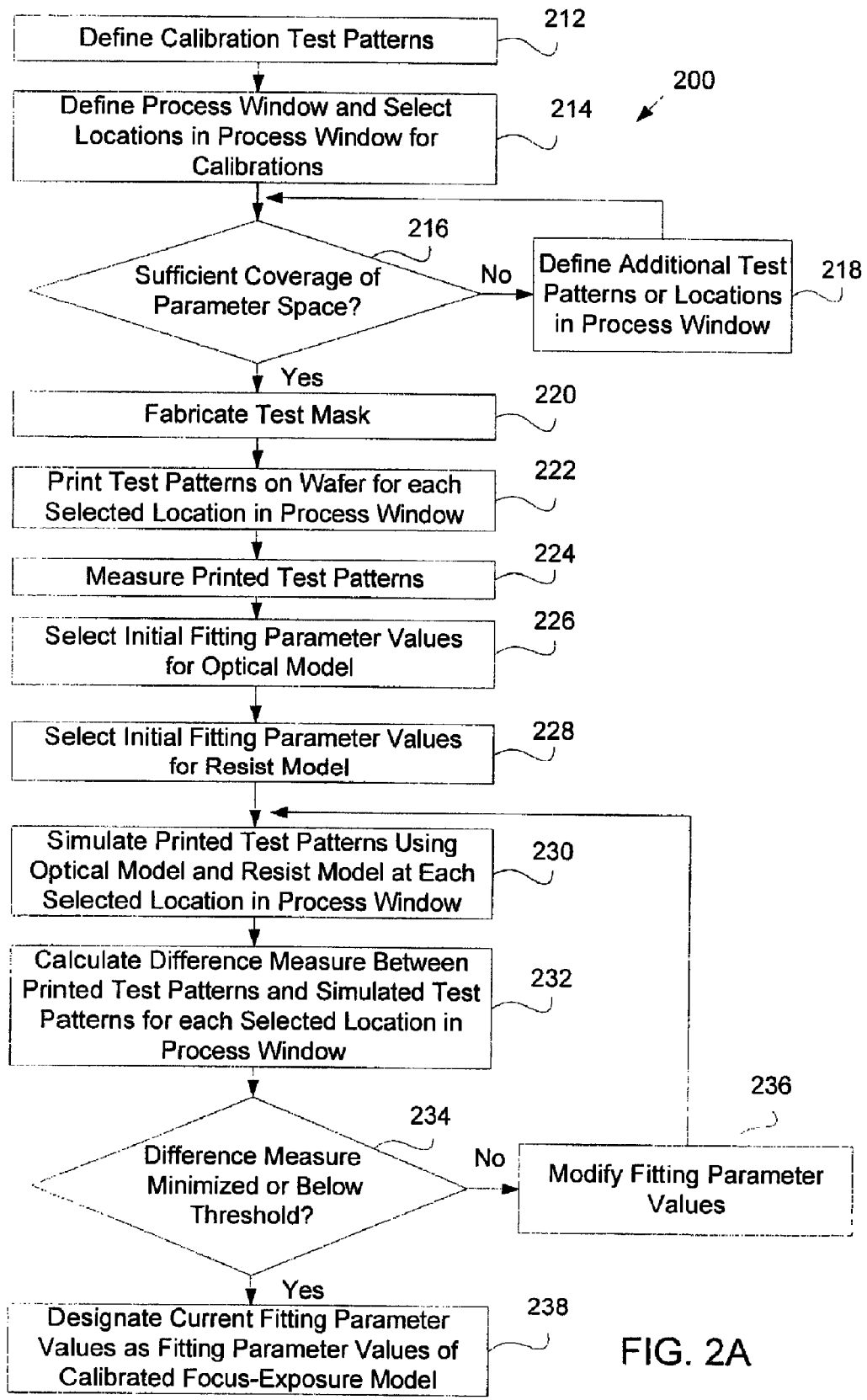
FIG. 2A is a flowchart of method steps for creating a focus-exposure model of a lithography process, according to one embodiment of the invention.

FIG. 2A is a flowchart of method steps 200 for creating a focus-exposure model of a lithography process, according to one embodiment of the invention. In step 212, a set of test patterns that will be manufactured on a test mask and printed onto test wafers using a lithography exposure tool are defined. These test patterns need to cover a full range of proximity interactions that are characteristic of the lithography process under consideration. A wide range of line/space patterns with varying pitches (from isolated to dense), and two-dimensional patterns such as line/space ends with varying gap sizes should be included. The line/space patterns span over a one-dimensional spatial frequency space while the line end patterns cover two-dimensional effects, in particular line-end pull back, pinching, etc. It is also possible to define a two-dimensional space by "pattern curvature" and construct test patterns accordingly, or use more complex two-dimensional test patterns that are representative of typical shapes found in the designs that the lithography model will be used on.

Given the importance of separating optical and resist effects, as discussed above, it may also be possible to enhance the calibration by inclusion of pattern types that are more sensitive to certain effects than others. A possible example might be test patterns that are particularly sensitive to optical effects such as particular optical aberrations or stray light (flare) if these effects are incorporated in the optical model of the simulation tool. It is well-known that certain pattern types show particular sensitivities to optical effects, for example, line pairs to coma and brick-wall patterns to three-foil. Such optical aberration or flare test patterns, possibly in combination with corresponding process variations may further improve model separation and calibration performance. Generally, particular pattern types may correlate specifically to particular model parameters. These pattern types can, e.g., be identified by a sensitivity analysis and may be given corresponding weights during the model optimization.

Another method of taking into account the optical aberrations in model calibration is to directly use the optical aberrations measured separately using tools specifically designed for optical aberration measurement. Some examples of the optical aberration measurement tools include those on-scanner-stage self-metrology tools provided by scanner vendors, such as ILIAS by ASML and other tools by Litel Corp. In this case, there is no need to include optical aberration-sensitive test patterns in the model calibration. The optical aberration parameters are not adjustable parameters to be calibrated during model calibration, but are fixed as known parameters in the optical model. A typical example of fixed optical parameters is the source map, i.e., the exact gray-scale shape and value of the illuminator, which is often measured and provided as a known entity not to be adjusted during model calibration. For any known optical parameters (e.g., source map, optical aberrations, and pupil shape), they are treated as fixed optical parameters in the optical model during model calibration.

Figure 3A:
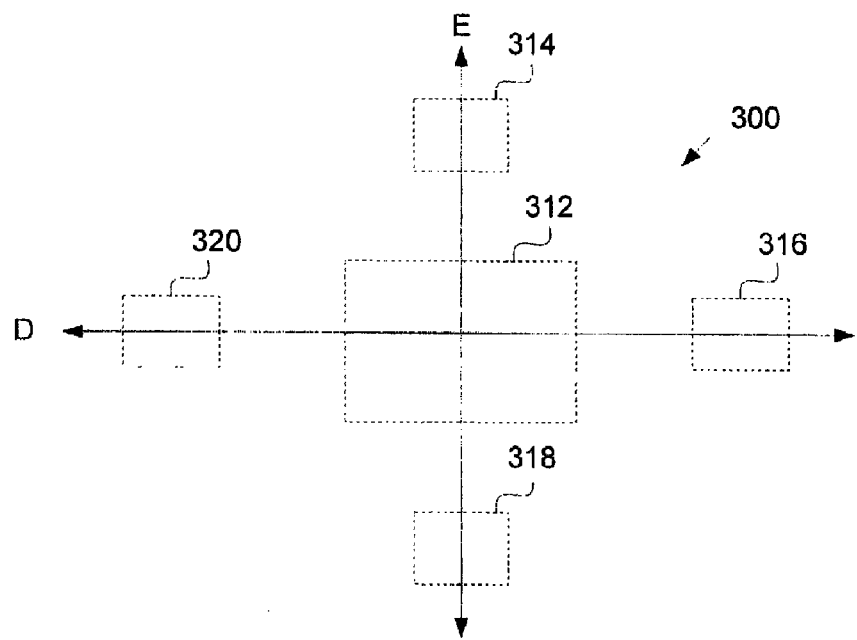
FIG. 3A is a diagram showing one embodiment of areas of sampling locations in a process window of a lithography process, according to the invention.
Figure 3B:
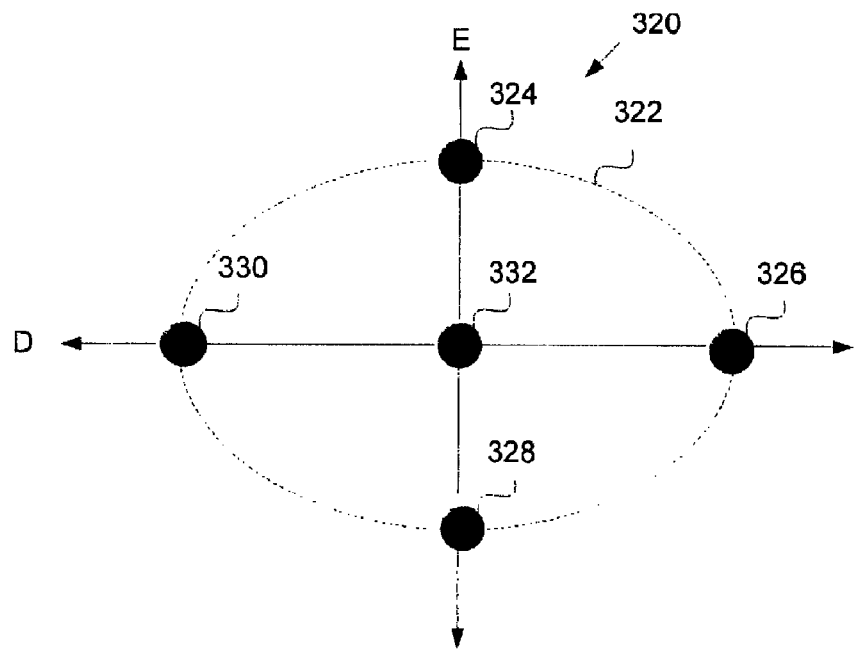
FIG. 3B is a diagram showing one embodiment of sampling locations in a process window of a lithography process, according to the invention.

After the set of test patterns has been defined, in step 214 a process window is defined and locations in the process window are selected for the calibrations. The process window is defined by selecting process conditions that will be varied for the model calibration and the range of these variations. For a typical application, an exposure-defocus space that approximately matches, or exceeds, the expected process window will be covered by sampling locations. This coverage is illustrated in FIG. 3A, which shows five areas 312, 314, 316, 318, and 320 of sampling locations in an exposure-defocus space 300. FIG. 3B shows one embodiment of an expected process window 322 in an exposure-defocus (E-D) space 320 and five sampling locations 324, 326, 328, 330, and 332, which include nominal or best conditions in the center 332 of process window 322 as well as four additional sampling locations 324, 326, 328, and 330 close to the boundary thereof. In practice, greater or fewer than five sampling locations may be used.

For each sampling location 324-332, the set of test patterns defined in step 212 is used to generate fitting parameters. Good fitting can be obtained with a reduced number of pattern types at some of the sampling locations. A complete set of test patterns, typically on the order of several thousands, may be measured at center 332 of process window 322, while a significantly reduced number of patterns, e.g., 10-20 percent of all, are utilized at sampling locations 324-330 at the periphery of process window 322. As a consequence, the total number of test pattern measurements required for focus-exposure model calibration is significantly smaller than the multiple-model calibration done separately for each individual sampling location, which is currently required by other existing calibration methods.

As has been noted before, the exposure-defocus space shown in FIGS. 3A and 3B may typically be used as a basis for the multidimensional calibration, but alternative and additional parameter dimensions may be used as well in an equivalent manner.

Returning to FIG. 2A, in step 216 the defined set of test patterns and process conditions is analyzed to ensure that a relevant parameter space is sufficiently well covered. Implementation of step 216 may involve a two-dimensional frequency space analysis of the test patterns, analysis of estimated process windows using nominal, best-effort, or default simulation parameters, or other methods. If the defined test patterns and process conditions do not provide sufficient coverage of the parameter space, in step 218 additional test patterns or locations in the process window are defined. The method then returns to step 216. While the analysis of step 216 may be considered as an integral part of the pattern and parameter selection, it is shown as a separate step in FIG. 2A to highlight the importance of this consideration. It has been shown in the literature that adding more test patterns to a calibration does not automatically improve accuracy, unless the additional data points provide a more complete coverage of the relevant parameter space.

If the defined test patterns and process conditions provide sufficient coverage of the parameter space, the method continues with step 220. In step 220, for applications in optical projection lithography, which is the current state-of-the-art in semiconductor manufacturing, a test mask is fabricated using the same mask technology and manufacturing method as will be used in the lithography process that is to be described by the calibrated focus-exposure model. The test mask contains the whole set of previously defined test patterns. It may for example be a binary mask, an attenuated phase-shift mask, or an alternating phase-shift or chromeless phase-shift mask, depending on the lithographic process under consideration. For future lithography, optical maskless technologies may be introduced, e.g., using spatial light modulators instead of a fixed, invariable template reticle. The focus-exposure model calibration will be equally applicable and beneficial for these technologies, where the step of mask fabrication can be considered a virtual one. In Optical Maskless Lithography (OML), the spatial light modulator settings corresponding to the selected test patterns (computed by any selected rasterization algorithm for the OML system) are used in place of the test mask.

In step 222, using the test mask, test wafers are printed in an exposure tool that is representative of the lithography process under consideration and using identical resist parameters and processing conditions as the device manufacturing process. This printing process will include application of a resist layer on the wafers, typically having one or more additional anti-reflection layers, a pre-exposure bake step, exposure in a scanner or stepper by projecting an image from the test mask onto the resist-coated wafer, a post exposure bake step, and resist development. The printing process may also include an additional step of etching the wafer, if such is also part of the simulation model. Printing of test patterns is performed using all process settings previously defined as sampling locations in the process window. Printing the test patterns for all of the sampling locations may be achieved by varying parameters stepwise between repeated exposures on a single substrate or by exposing a number of test wafers separately.

In step 224, the test patterns on the fully processed wafers are measured using suitable metrology tools to generate actual results. Step 224 may include line-width and line end-pullback measurements using a CD-SEM or CD-AFM, generation and analysis of two-dimensional SEM image data, optical scatterometry analysis of CDs, or other measurements that can be correlated to predicted pattern parameters derived from the focus-exposure model.

Figure 8:
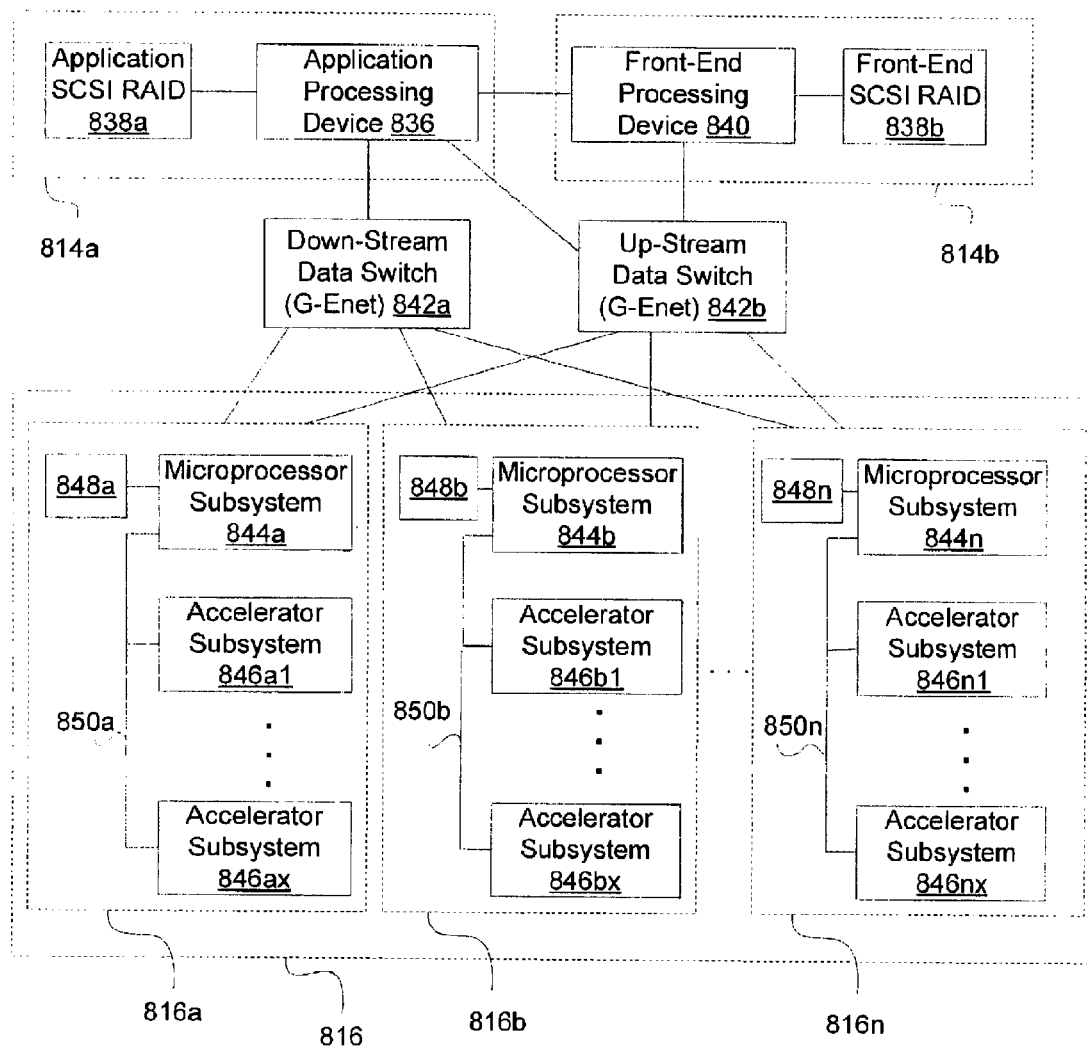
FIG. 8 is a block diagram of one embodiment of a lithography simulation system, according to the invention.

The actual results derived from the printed test patterns need to be matched by simulated test patterns from a selected model of the lithography process. The model of the lithography process includes one or more model modules representing the lithography process. The model includes at least an optical model, and may optionally include a resist model, a mask model, and any other appropriate models when applicable, e.g., an etch model after the resist model. In the method of FIG. 2A, the model only includes an optical model and a resist model for ease of illustration. In step 226, initial fitting parameter values for an optical model are selected and in step 228, initial fitting parameter values for a resist model are selected. The initial fitting parameter values for the optical model and the resist model may be nominal, default, or best-guess values for the fitting parameters. For the optical model, the fitting parameters are all the adjustable parameters of the optical model. The exposure dose and defocus are not considered as adjustable parameters but will be varied in accordance with first principles to correspond to the selected sampling locations in the process window. In step 230, the printed test patterns are simulated using the optical model and the resist model. In the preferred embodiment, the simulation of step 230 is implemented using the system and method disclosed in U.S. Pat. No. 7,003,758. In one embodiment, a lithography simulation system 800, described below in conjunction with FIG. 8, is utilized to perform step 230. In step 230, simulations are performed for all test patterns and for all locations in the process window defined in steps 212-216 to produce simulated results. During the simulations, the exposure dose and defocus parameters of the model are varied in accordance with first principles and the values of the fitting parameters of the model, including all of the fitting parameters of the resist model, remain unchanged.

Next, in step 232, the pattern parameters of the simulated results are then compared against the actual results, e.g., by comparing simulated line/space or gap widths to corresponding CD-SEM measurements. Alternatively, "measurements" may be performed on simulated resist (or etched) contour lines that represent the predicted two-dimensional printed patterns, and these measurements on simulated patterns are compared against the equivalent measurements of printed patterns. The measurements may involve scalar values such as CD or line-end pull back, edge placement errors, or more complex evaluations of corresponding two-dimensional shapes. The CD measurement is used in the discussion below for illustrative purposes, and measurements of any other pattern parameters may be used in a similar fashion and are within the scope of the invention.

To quantify the agreement between the simulated results and the actual results, in step 232 a difference measure between the printed test patterns and the simulated test patterns is calculated for each sampling location in the process window. In one embodiment, the difference measure is represented by a cost function that can be calculated to reflect the "distance" between simulated and measured values in a Root-Mean-Square (RMS) sense as defined below in Equation 1. In Equation 1, RMS(k) is the "distance" between the simulated and measured CD values after the k-th iteration of the cost function, M is the total number of sampling locations in the process window, N is the number of test patterns to be measured at each sampling location in the process window, $CD_{meas}(E_i, F_i, TP_j)$ is the actual CD measurement at the j-th test pattern (TP) fabricated with the focus and exposure values at the i-th sampling location in the process window ($E_i$, $F_i$), where E is an exposure dose value and F is a focus value, and $CD_{simu}(E_i, F_i, TP_j, V_k)$ is the simulated CD measurement of the corresponding test pattern using the focus and exposure values at the i-th sampling location in the process window, where $V_k$ is a set of fitting parameters $V_k=(v_{1k}, v_{2k}, \ldots, v_{Lk})$, where L is the total number of fitting parameters of the optical model and the resist model and k indicates the adjusted fitting parameters after the k-th iteration. The definition of the cost function may include different weight factors, $W_{i,j}$, for various data points or other adjustments.

$$RMS(k) = SQRT\left((1/M \times N) \times \sum_{i=1}^{M} \sum_{j=1}^{N} W_{i,j}[CD_{meas}(E_i, F_i, TP_j) - CD_{simu}(E_i, F_i, TP_j, V_k)]^2\right) \quad \text{(Eq. 1)}$$

The cost function value calculated by Equation 1 is called the RMS difference between the simulated results and the actual results, and in one embodiment is used as the difference measure in step 232. The magnitude of the cost function is a measure of the quality of the fitting between the simulated results and the actual results, and the goal of the calibration process is to optimize the focus-exposure model by varying the adjustable fitting parameters to minimize the cost function, e.g., the RMS(k), as shown in Equation 2.

$$\text{MIN=Minimize(RMS}(k)), k=1,2, \quad \text{(Eq. 2)}$$

In step 234, a determination is made whether the calculated difference measure is below a predetermined threshold. Alternatively, a global minimum of the difference measure is sought. If the difference measure is not minimized or below the predetermined threshold, the method continues in step 236, in which fitting parameter values of the optical model module and the resist model module are adjusted or tuned in a certain sequence. The method then returns to step 230 to simulate the printed test patterns using the adjusted fitting parameter values for the optical model and the resist model. Then in step 232, a difference measure between the new simulated test patterns and the printed test patterns is calculated and the difference measure is evaluated in step 234. Steps 236, 230, 232, and 234 are repeated until the current difference measure is minimized or below the predetermined threshold.

Then, in step 238, the current fitting parameter values of the optical model and the resist model are designated as the fitting parameter values for the calibrated focus-exposure model. The calibrated focus-exposure model can then be used to simulate the lithography process at any location within the process window.

A key characteristic of the calibration of the focus-exposure model is the inclusion of data points along several dimensions of process parameters during the simulation of the test patterns, typically including several process settings in an exposure-defocus process window space, while corresponding constraints are placed on fitting parameter values during the calibration procedure. This simply means that only the process conditions in the optical model that have actually been adjusted in the test wafer printing process between sampling locations are allowed to change in accordance with first principles in the simulations of the test patterns at the sampling locations, e.g., focus and exposure dose in the method of FIG. 2A, and all other fitting parameters of the model are held constant between the sampling locations in the process window. A single, universal, set of model parameter values is thus derived from the calibration process that can be used to generate "new" models (i.e., predicted patterns) at any exposure-dose setting within a reasonable vicinity of the initial sampling area in the process window, and not just at the exact locations used for calibration. Even if a lithography process will only be simulated at nominal condition, better performance is achieved when the focus-exposure model is calibrated using data collected not only at the center of the process window but at multiple locations some distance from the center of the process window.

Figure 2B:
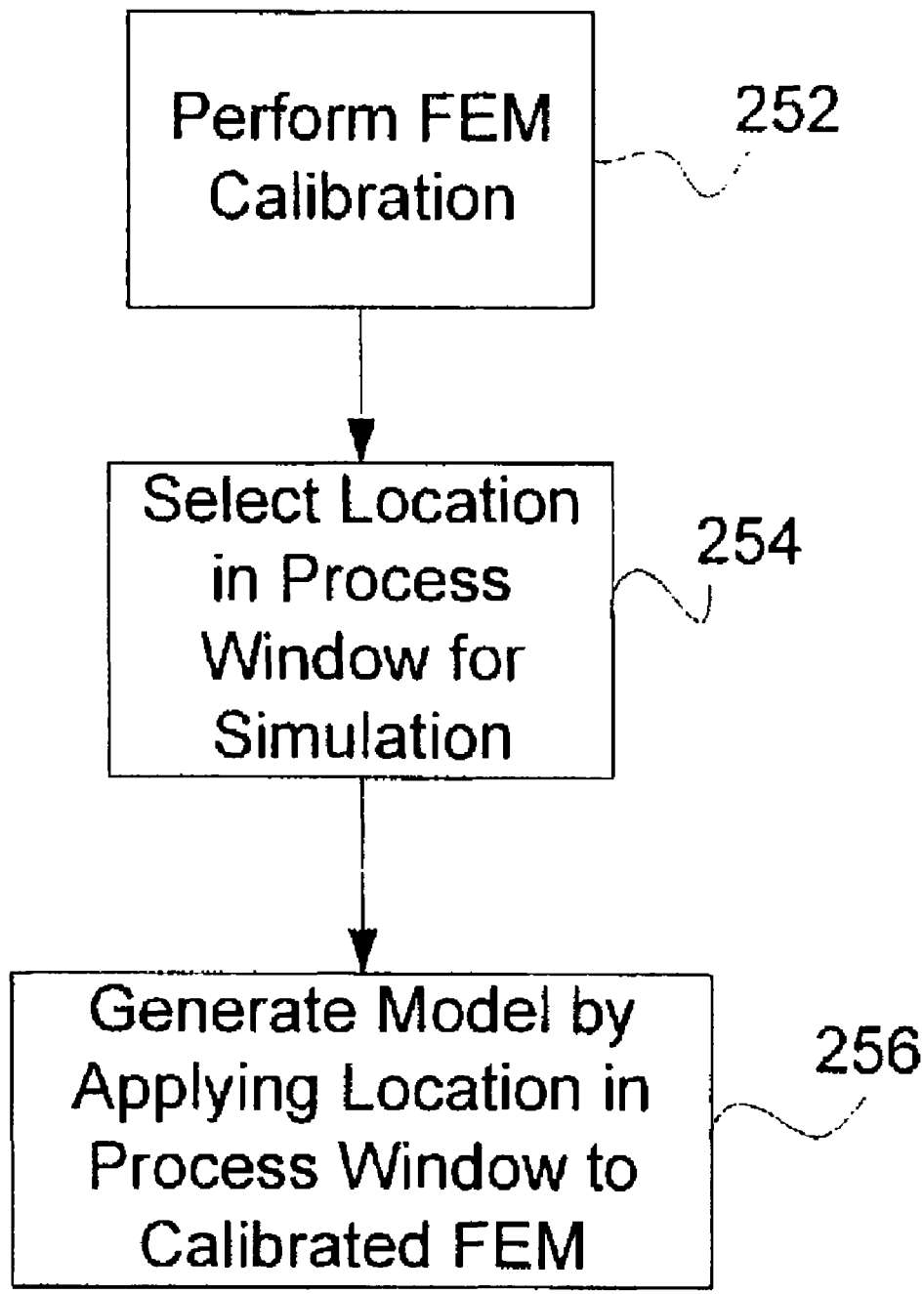
FIG. 2B is a flowchart of method steps for generating a focus-exposure model at any arbitrary location in a process window, according to one embodiment of the invention.

FIG. 2B is a flowchart of method steps for generating a model at any location in a process window, according to one embodiment of the invention. In step 252, the focus-exposure model is calibrated according to the method described above in conjunction with FIG. 2A. In step 254, a location in the process window where the lithography process is to be simulated is selected. The selected location can be anywhere in the process window, i.e., the selected location can be but is not required to be one of the sampling locations used during the calibration of the focus-exposure model. Then, in step 256, a model is generated by applying the set of values for the varied model parameters (e.g., exposure and focus) that corresponds to the selected location in the process window to the calibrated focus-exposure model in accordance with first principles while all of the other calibrated model parameters (i.e., fitting parameters) are held at the final fitted values of the FEM. The model may then be used to simulate the performance of the lithography process at the selected location in the process window.

Figures 4A, 4B:
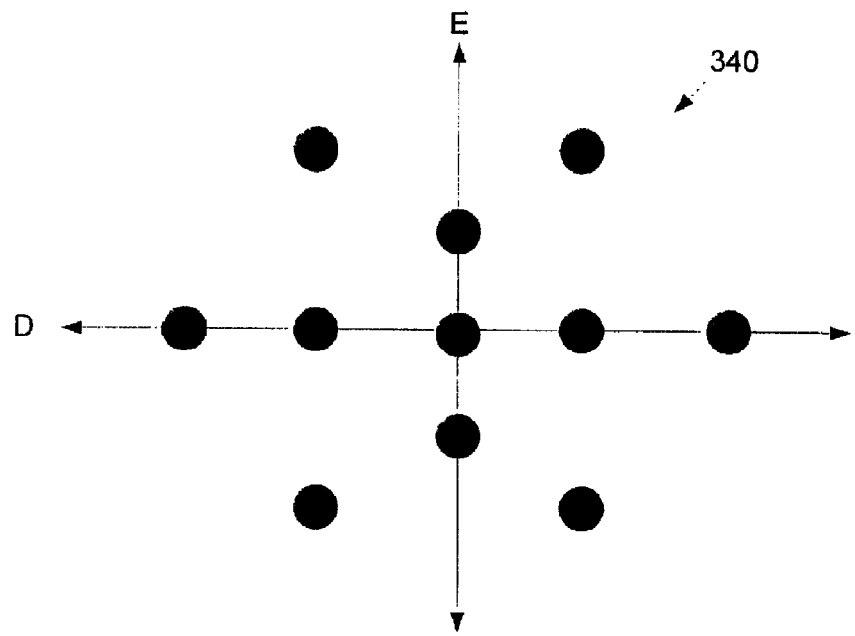
FIG. 4A is a diagram showing another embodiment of sampling locations in a process window of a lithography process, according to the invention.
FIG. 4B is a chart showing sampling locations for calibrating a focus-exposure model, according to one embodiment of the invention.

An exemplary calibration of a focus-exposure model for a 65 nm lithography process was performed. A total set of approximately 2000 one-dimensional and two-dimensional test patterns were defined for model calibration in this 65 nm process. Eleven locations within a process window were selected for the calibration. These locations are shown schematically in FIG. 4A. Test wafers were printed for these eleven locations in the process window. As shown in FIG. 4B, these locations include focus offsets of +/% 31 100 nm and +/−150 nm, as well as exposure variations of +/−2.41% to +/−4.82% from nominal values. Several calibration runs were performed for different subsets of the eleven locations shown in FIG. 4B. In the cases where fewer than all eleven locations were used for calibration, the remaining data was used for model verification by determining the deviation of the simulated from the measured test parameter values. The full set of approximately 2000 test patterns were used at nominal condition (the center of the process window), while at all other sampling locations only 300, i.e., 15%, of the test patterns were included. All measurements were scalar CD measurements, and the accuracy of the model is quantified by the RMS deviation between simulated and measured CD values.

FIG. 5 shows the results of the calibration runs. The second column gives a graphical representation of the sampling locations in the process window used for calibration; data from all remaining sites was used for model verification. The points shown in each cell of the second column correspond to the equivalent locations shown in FIG. 4B. The number of calibration and verification sites is given in column 3 and 4 of FIG. 5, respectively. Column 5 lists the total RMS in nm over all the sites and all patterns, while the maximum RMS at any single sampling location is given in the final column. The numbers indicate that while the best overall fitting is obtained when using data from all 11 sampling locations, there is only very minor degradation of the fit quality even after reducing the number of sampling locations to only 3 along the defocus direction. Therefore, it is a preferred best practice to calibrate the focus-exposure model using data collected at only three sampling locations in the process window: nominal condition, a positive defocus condition at nominal exposure, and a negative defocus condition at nominal exposure. Also, with the exception of the exposure only case, where sampling locations with exposure variations only were chosen, all other results indicate that the model accuracy is not sensitive to the exact selection of sampling locations in the process window. The method for creating a calibrated focus-exposure model even allows for a moderate extrapolation outside the parameter range covered by the calibration data.

In the exposure only case, where no defocus data was included in the calibration, and only small variations in dose, the parameter fitting process resulted in wrong optical parameters. This result is not too surprising. As has been discussed before, defocus effects may be mimicked by resist parameters, e.g., diffusion constants, and without through-focus data the fitting is not sufficiently constrained to generate accurate model parameter values. Therefore, a criterion for selecting off-nominal sampling locations for model calibration is to include at least one sampling location off the nominal focus to obtain accurate final values for the fitting parameters.

The method of the invention provides significant benefits over the current practice of calibrating models separately for different discrete points in a process window. FIG. 6 provides a comparison between the two calibration approaches, i.e., calibration of the focus-exposure model and calibration of multiple discrete models, respectively. In FIG. 6, it is assumed that each of the sampling locations requires N measurements and that the number of the extra sampling locations in addition to the nominal sampling location is x. In the prior art multiple discrete model, the total number of measurements required for all (1+x) locations is therefore (1+x) N. In contrast, because as mentioned above the focus-exposure model requires only 15% of the measurements at the extra (i.e., non-nominal) sampling locations, the total number of measurements required for all (1+x) locations becomes only (1+0.15 x) N. Also, while the prior art multiple discrete model requires separate calibration at each of the (1+x) locations, the focus-exposure model requires only one calibration with measurements at all locations in the process window considered simultaneously. In addition, unlike the prior art multiple discrete model, the focus-exposure model has separable common mask, optical, and resist terms. Furthermore, the focus-exposure model is capable of generating unlimited additional models within the entire boundary defined by the sampling locations (i.e., producing accurate predictions at an unlimited number of locations within the process window) as shown in FIG. 2B, while the prior art multiple discrete model can be accurate only at the (1+x) locations where separate calibrations have been conducted.

Figure 7:
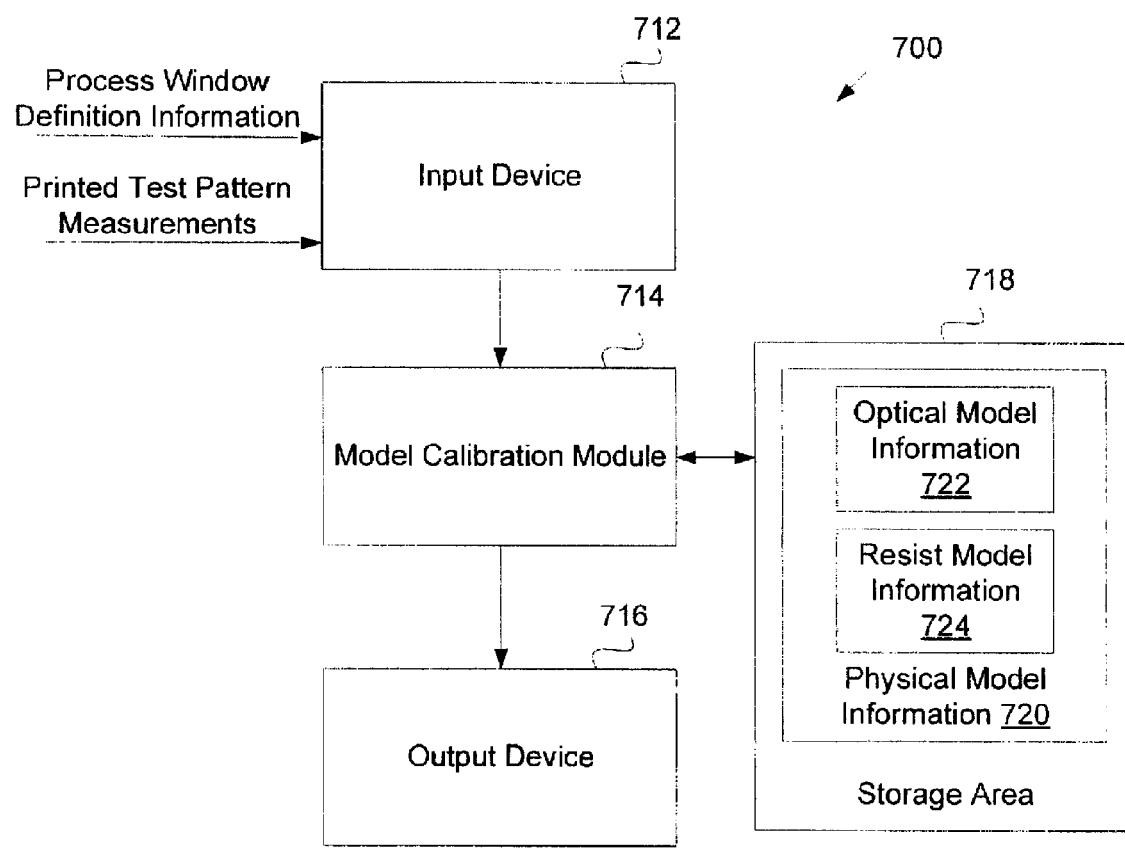
FIG. 7 is a block diagram of one embodiment of a system for creating a focus-exposure model, according to the invention.

FIG. 7 is a block diagram of one embodiment of a system 700 for creating a focus-exposure model of a lithography process, according to the invention. System 700 includes, but is not limited to, an input device 712, a model calibration module 714, an output device 716, and a storage area 718.

Storage area 718 includes, but is not limited to, physical model information 720. Physical model information 720 includes, but is not limited to, optical model information 722 and resist model information 724. Optical model information 722 includes an optical model and a set of possible values for each optical model parameter, and resist model information 724 includes a resist model and a set of possible values for each resist model parameter. Model calibration module 714 receives process window definition information and printed test pattern measurements via input device 712. Model calibration module 714 uses the process window definition information and the printed test pattern measurements in conjunction with optical model information 722 and resist model information 724 to generate a calibrated focus-exposure model. The calibrated focus-exposure model is capable of describing the performance of a lithography process over a process window described by at least two continuously adjustable optical parameters.

FIG. 8 is a diagram of one embodiment of a lithography simulation system 800, according to the invention. System 800 includes, but is not limited to, one or more general purpose-type computing systems, including but not limited to, an application processing system 814a and a front-end processing system 814b. Application processing system 814a is suitably configured to handle job management of the overall operations of system 800. In particular, in one embodiment, application processing system 814a includes an application processing device 836 and an application SCSI RAID 838a. Application processing device 836 is suitably programmed to provide management of the operations of the various components of system 800. In this regard, for example, application processing device 836 may be programmed to partition a design database for the various components of an accelerator system 816, thereby specifying the individual jobs, functions or processes performed by components of accelerator system 816. Application SCSI RAID hard-disk array 838a provides storage for the programs and data (for example, design database) used by application processing device 836.

Front-end processing system 814b includes a front-end processing device 840 which is suitably programmed to handle or perform direct interaction with the user or operator (i.e., the "outside world") via, for example, client computer(s) (not illustrated) that provide operator or user access to system 800 for job setup and/or results review/analysis. A front-end SCSI RAID hard-disk array 838b, associated with front-end processing device 840 should be a high capacity storage device, since front-end SCSI RAID 838b is used to store results and images of many simulation jobs. Front-end processing system 814b also communicates with application processing system 814a, to provide or retrieve data to or from application SCSI RAID 838a (for example, the design database), and instructs application processing system 814a to start a job, as instructed by the user or operator.

Application processing system 814a and front-end processing system 814b connect with accelerator system 816, for example, through high speed switches (for example, gigabit-Ethernet switches 842a and 842b). Switches 842a and 842b may be Dell 5224 Power Connect, manufactured and provided by Dell Computer (Austin, Tex., USA). The implementation and operation of the Dell 5224 Power Connect are described in detail in application notes, technical/journal articles and data sheets, all of which are incorporated by reference herein.

In one embodiment, all or substantially all of the actual computationally intensive tasks of lithography simulation may be conducted by accelerator system 816, and, in particular, one or more accelerator components 816a-n. This architecture allows scalable computation capacity, by changing the number of accelerator hardware components 816a-n. Moreover, this architecture also enables or enhances overall fault-tolerance of system 800. For example, should a given accelerator hardware component 816a-n fail, its jobs may be re-assigned to the other accelerator hardware components 816a-n, and, in this way, system 800 maintains its operational condition/state.

In particular, accelerator system 816 may include one or more accelerator components 816a-n, each having one of microprocessor subsystem 844a-n (including one or more microprocessors), one or more accelerator subsystems 846a-n, and local or resident memory storage 848a-n coupled to an associated microprocessor subsystem 844a-n. The extent or amount of hardware acceleration capability may be balanced with microprocessor subsystems 844a-n, depending on the extent or amount of computation to be performed.

In one embodiment, microprocessor subsystems 844a-n each includes two Xeon microprocessors manufactured by Intel (Santa Clara, Calif., USA). The accelerator subsystems 846a-n each includes a plurality of Application-Specific Integrated Circuit (ASIC), special-purpose DSP integrated circuits, and/or programmable gate arrays (for example, field-programmable gate arrays ("FPGAs")). In fact, each of accelerator subsystems 846a-n may include multiple accelerator subsystems, for example, accelerator subsystem 846a may include all the accelerator subsystems 846a1-6ax, as illustrated in FIG. 8. In this way, when fully utilized, each of accelerator subsystems 846a-n contains computational capacity of roughly twenty-five Xeon microprocessors.

A bus 850a-n facilitates high-speed communication between microprocessor subsystem 844a-n and associated accelerator subsystem(s) 846a-n. The communication protocols and techniques on bus 850a-n may be PCI, PCIX, or other high-speed communication protocols and techniques. Indeed, any high-speed technique, whether now known or later developed, may be implemented over bus 850a-n. Notably, in one embodiment, the bus interface may be implemented using a 21P100BGC PCI-X bridge (64 bit/133 MHz) from International Business Machines Corporation (Armonk, N.Y., USA). The implementation and operation of the 21P100BGC are described in detail in application notes, technical/journal articles and data sheets, all of which are incorporated by reference herein.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A computer-implemented method for creating a model of a lithography process, comprising:

defining a set of model parameters and a set of fitting parameters having variable values for the model, the set of model parameters defining a process window for the lithography process in a parameter space;

selecting a set of initial values for the set of fitting parameters;

selecting a plurality of sampling locations within the process window, the plurality of sampling locations being a subset of all possible process conditions within the process window;

generating, using the computer, simulated results of the lithography process at each of the plurality of sampling locations within the process window using the model with the set of initial values by simulating the lithography process with varying values of the model parameters corresponding to the plurality of sampling locations within the process window while holding constant the initial values;

comparing, using the computer, the simulated results with actual results of the lithography process at the plurality of sampling locations within the process window to produce a total difference measure between the simulated results and the actual results at the plurality of sampling locations;

modifying, using the computer, the set of fitting parameter values and generating additional simulated results at each of the plurality of sampling locations within the process window to identify optimum fitting parameter values such that the total difference measure between the actual results and simulated results produced using the optimum fitting parameter values is below a predetermined threshold; and finalizing the model by including the optimum fitting parameter values in the model, the finalized model being capable of simulating the lithography process at any location within the entire process window.

2. The method of claim 1, wherein the model is used to simulate the lithography process at a single location within the process window.

3. The method of claim 1, wherein the model is used to simulate the lithography process at a location within the process window that is not one of the plurality of sampling locations by applying parameter values corresponding to the location within the process window to the model in accordance with first principles without changing the optimum fitting parameter values.

4. The method of claim 1, wherein the set of model parameters further includes one or more first principle parameters.

5. The method of claim 4, wherein the one or more first principle parameters includes one or more of illumination source, numerical aperture, and optical aberrations.

6. The method of claim 1, further comprising including a resist model module in the model of the lithography process.

7. The method of claim 1, further comprising including a mask model module in the model of the lithography process.

8. The method of claim 1, wherein the plurality of sampling locations include sampling locations at nominal exposure and a corresponding plurality of varying values of focus.

9. The method of claim 1, further comprising:
selecting a set of test patterns for a test mask, wherein the set of test patterns covers a full range of proximity interactions that are characteristic of the lithography process;
printing the set of test patterns on a wafer to form a set of test structures; and
using the set of test structures to produce the actual results.

10. The method of claim 1, wherein the simulated results and the actual results are critical dimension measurements.

11. The method of claim 1, wherein the total difference measure is a root mean square difference.

12. The method of claim 1, wherein the model parameters comprise focus and exposure, and wherein the model comprises a focus-exposure model.

13. The method of claim 1, wherein the model parameters include one or both of an optical parameter and a resist parameter.

14. A non-transitory computer-readable medium storing instructions for causing a computer to create a model of a lithography process by performing:
storing a set of model parameters and a set of fitting parameters having variable values for the model, the set of model parameters defining a process window for the lithography process in a parameter space;
storing a set of initial values for the set of fitting parameters;
storing a plurality of sampling locations within the process window, the plurality of sampling locations being a subset of all possible process conditions within the process window;
generating simulated results of the lithography process at each of the plurality of sampling locations using the model with the set of initial values by simulating the lithography process with varying values of the model parameters corresponding to the plurality of sampling locations while holding the initial values constant;
comparing the simulated results with actual results of the lithography process at the plurality of sampling locations to produce a total difference measure between the simulated results and the actual results at the plurality of sampling locations;
modifying the set of fitting parameter values and generating additional simulated results at each of the plurality of sampling locations such that the total difference measure between the actual results produced using the optimum fitting parameter values is below a predetermined threshold; and
finalizing the model by including the optimum fitting parameter values in the model, the finalized model being capable of simulating the lithography process at any location within the process window.

15. The non-transitory computer-readable medium of claim 14, wherein the model is used to simulate the lithography process at a single location within the process window.

16. The non-transitory computer-readable medium of claim 14, wherein the model is used to simulate the lithography process at a location within the process window that is not one of the plurality of sampling locations by applying parameter values corresponding to the location within the process window to the model in accordance with first principles without changing the optimum fitting parameter values.

17. The non-transitory computer-readable medium of claim 14, wherein the set of model parameters further includes one or more first principle parameters.

18. The non-transitory computer-readable medium of claim 17, wherein the one or more first principle parameters includes one or more of illumination source, numerical aperture, and optical aberrations.

19. The non-transitory computer-readable medium of claim 14, wherein the instructions further cause the computer to include a resist model module in the model of the lithography process.

20. The non-transitory computer-readable medium of claim 14, wherein the instructions further cause the computer to include a mask model module in the model of the lithography process.

21. The non-transitory computer-readable medium of claim 14, wherein the plurality of sampling locations includes sampling locations at nominal exposure and a corresponding plurality of varying values of focus.

22. The non-transitory computer-readable medium of claim 14, wherein the total difference measure is a root mean square difference.

23. The non-transitory computer-readable medium of claim 14, wherein the model parameters comprise focus and exposure, and wherein the model comprises a focus-exposure model.

24. The non-transitory computer-readable medium of claim 14, wherein the model parameters include one or both of an optical parameter and a resist parameter.

* * * * *